US006911622B2

(12) United States Patent
Lauer et al.

(10) Patent No.: US 6,911,622 B2
(45) Date of Patent: Jun. 28, 2005

(54) LASER PROCESSING

(75) Inventors: William Lauer, Westford, MA (US); Pierre Trepagnier, Medford, MA (US); Donald Victor Smart, Boston, MA (US); James Cordingley, Littleton, MA (US); Michael Plotkin, Newton, MA (US)

(73) Assignee: General Scanning, Inc., Billerica, MA (US)

( * ) Notice: Subject to any disclaimer, the term of this patent is extended or adjusted under 35 U.S.C. 154(b) by 130 days.

(21) Appl. No.: 10/428,938

(22) Filed: May 5, 2003

(65) Prior Publication Data

US 2003/0189032 A1 Oct. 9, 2003

Related U.S. Application Data

(63) Continuation of application No. 09/968,541, filed on Oct. 2, 2001, now Pat. No. 6,559,412, which is a continuation of application No. 09/212,974, filed on Dec. 16, 1998, now Pat. No. 6,300,590.

(51) Int. Cl.[7] .............................................. B23K 26/00

(52) U.S. Cl. .............................. 219/121.69; 219/121.68

(58) Field of Search ....................... 219/121.69, 121.68, 219/121.67, 121.85, 121.6

(56) References Cited

U.S. PATENT DOCUMENTS

| 3,740,523 A | 6/1973 | Cohen et al. ................ 219/121 |
| 4,044,222 A | 8/1977 | Kestenbaum .......... 219/121.71 |
| 4,483,005 A | 11/1984 | Smart ........................... 372/25 |
| 4,705,698 A | 11/1987 | Van Dine ................... 427/53.1 |

(Continued)

FOREIGN PATENT DOCUMENTS

| JP | 62086851 A2 | 4/1987 | ........... H01L/27/01 |
| WO | WO98/28104 | 7/1998 | ........... B23K/26/00 |

OTHER PUBLICATIONS

Brannon, James H.; "Excimer–Laser Ablation and Etching"; Circuits and Devices, Sep. 1990.
General Scanning, Inc., "Laser Link Fusing: Guidelines for the Applications of M3XX Laser Systems in Semiconductor Link Fusing Processes"; Jan., 1997.
"IBM Delivers World's First Copper Chips"; Sep. 1, 1998.
Lammers, David; "Motorola and IBM Show Off SRAMs with Copper Interconnects"; EE Times; Jun. 11, 1998.
Lineback, J. Robert and Wade, Will; "Copper Moving Faster on Broad Industry Front"; Semiconductor Business News; Aug., 1998.
Srinivasan, R. and Braren, Bodil; "Ultraviolet Laser Ablation of Organic Polymers"; Chem. Rev. 89, 1303–1316; 1989, no month.
Zanhowsky, Diana; "Laser Systems Boost Memory Repair"; Laser Focus World; pp. 181–184; Aug., 1998.

*Primary Examiner*—M. Alexandra Elve
(74) *Attorney, Agent, or Firm*—Fish & Richardson P.C.

(57) ABSTRACT

The invention provides a system and method for vaporizing a target structure on a substrate. According to the invention, a calculation is performed, as a function of wavelength, of an incident beam energy necessary to deposit unit energy in the target structure. Then, for the incident beam energy, the energy expected to be deposited in the substrate as a function of wavelength is calculated. A wavelength is identified that corresponds to a relatively low value of the energy expected to be deposited in the substrate, the low value being substantially less than a value of the energy expected to be deposited in the substrate at a higher wavelength. A laser system is provided configured to produce a laser output at the wavelength corresponding to the relatively low value of the energy expected to be deposited in the substrate. The laser output is directed at the target structure on the substrate at the wavelength corresponding to the relatively low value of the energy expected to be deposited in the substrate, in order to vaporize the target structure.

25 Claims, 6 Drawing Sheets

U.S. PATENT DOCUMENTS

| | | | |
|---|---|---|---|
| 4,752,455 A | 6/1988 | Mayer | 427/53 |
| 4,853,758 A | 8/1989 | Fischer | 357/51 |
| 4,970,369 A | 11/1990 | Yamazaki et al. | 219/121.85 |
| 5,022,040 A | 6/1991 | Pollack et al. | 372/69 |
| 5,235,154 A | 8/1993 | Economikos | 219/121 |
| 5,265,114 A | 11/1993 | Sun et al. | 372/69 |
| 5,336,636 A | 8/1994 | Burmer | 437/173 |
| 5,473,624 A | 12/1995 | Sun | 372/69 |
| 5,525,831 A | 6/1996 | Ohkawa et al. | 257/543 |
| 5,569,398 A | 10/1996 | Sun et al. | 219/121.68 |
| 5,611,946 A | 3/1997 | Leong et al. | 219/121.6 |
| 5,685,995 A | 11/1997 | Sun et al. | 219/121.6 |
| 5,968,847 A | 10/1999 | Ye et al. | 438/734 |
| 5,998,759 A | 12/1999 | Smart | 219/121.69 |
| 6,025,256 A | 2/2000 | Swenson et al. | 438/601 |
| 6,057,180 A | 5/2000 | Sun et al. | 438/432 |
| 6,057,221 A * | 5/2000 | Bernstein et al. | 438/601 |
| 6,144,118 A | 11/2000 | Cahill et al. | 310/12 |
| 6,162,577 A * | 12/2000 | Felter et al. | 430/270.1 |
| 6,181,728 B1 | 1/2001 | Cordingley et al. | 372/106 |
| 6,337,462 B1 | 1/2002 | Smart | 219/121.68 |
| 6,339,604 B1 | 1/2002 | Smart | 372/26 |
| 6,791,059 * | 9/2004 | Smart | 219/121.68 |
| 2005/0011872 * | 1/2005 | Smart | 219/121.68 |

\* cited by examiner

LASER PROCESSING

This is a continuation of U.S. patent application Ser. No. 09/968,541, filed Oct. 2, 2001 and issued as U.S. Pat. No. 6,559,412 on May 6, 2003, which is a continuation of U.S. patent application Ser. No. 09/212,974, filed Dec. 16, 1998 and issued as U.S. Pat. No. 6,300,590 on Oct. 9, 2001.

BACKGROUND OF THE INVENTION

This invention relates to laser processing systems and methods, including systems and methods for removing, with high yield, closely-spaced metal link structures or "fuses" on a silicon substrate of an integrated circuit or memory device.

Laser systems can be employed to remove fuse structures ("blow links") in integrated circuits and memory devices such as ASICs, DRAMs, and SRAMs, for purposes such as removing defective elements and replacing them with redundant elements provided for this purpose ("redundant memory repair"), or programming of logic devices. Link processing laser systems include the M320 and M325 systems manufactured by General Scanning, Inc, which produce laser outputs over a variety of wavelengths, including 1.047 $\mu$m, 1.064 $\mu$m, and 1.32 $\mu$m.

Economic imperatives have led to the development of smaller, more complex, higher-density semiconductor structures. These smaller structures can have the advantage of operation at relatively high speed. Also, because the semiconductor device part can be smaller, a greater number of parts can be included in a single wafer. Because the cost of processing a single wafer in a semiconductor fabrication plant can be almost independent of the number of parts on the wafer, the greater number of parts per wafer can translate into lower cost per part.

In the 1980s, semiconductor device parts often included polysilicon or silicide interconnects. Although poly-based interconnects are relatively poor conductors, they were easily fabricated using processes available at the time, and were well-suited to the wavelengths generated by the Nd:YAG lasers commonly available at the time. As geometries shrank, however, the poor conductivity of polysilicon interconnects and link structures became problematic, and some semiconductor manufacturers switched to aluminum. It was found that certain conventional lasers did not cut the aluminum links as well as they had cut polysilicon links, and in particular that damage to the silicon substrate could occur. This situation could be explained by the fact that the reflection in aluminum is very high and the absorption is low. Therefore, increased energy must be used to overcome this low absorption. The higher energy can tend to damage the substrate when too much energy is used.

Sun et al., U.S. Pat. No. 5,265,114 advances an "absorption contrast" model for selecting an appropriate laser wavelength to cut aluminum and other metals such as nickel, tungsten, and platinum. In particular, this patent describes selecting a wavelength range in which silicon is almost transparent and in which the optical absorption behavior of the metal link material is sufficient for the link to be processed. The patent states that the 1.2 to 2.0 $\mu$m wavelength range provides a high absorption contrast between a silicon substrate and high-conductivity link structures, as compared with laser wavelengths of 1.064 $\mu$m and 0.532 $\mu$m.

SUMMARY OF THE INVENTION

The invention provides a system and method for vaporizing a target structure on a substrate. According to the invention, a calculation is performed, as a function of wavelength, of an incident beam energy necessary to deposit unit energy in the target structure. Then, for the incident beam energy, the energy expected to be deposited in the substrate as a function of wavelength is calculated. A wavelength is identified that corresponds to a relatively low value of the energy expected to be deposited in the substrate, the low value being substantially less than a value of the energy expected to be deposited in the substrate at a higher wavelength. A laser system is provided configured to produce a laser output at the wavelength corresponding to the relatively low value of the energy expected to be deposited in the substrate. The laser output is directed at the target structure on the substrate at the wavelength corresponding to the relatively low value of the energy expected to be deposited in the substrate, in order to vaporize the target structure.

Certain applications of the invention involve selection of a wavelength appropriate for cutting a metal link without producing unacceptable damage to a silicon substrate, where the wavelength is less than, rather than greater than, the conventional wavelengths of 1.047 $\mu$m and 1.064 $\mu$m. This method of wavelength selection is advantageous because the use of shorter wavelengths can result in smaller laser spots, other things being equal, and hence greater ease in hitting only the desired link with the laser spot. In particular, other things being equal, laser spot size is directly proportional to wavelength according to the formula: spot size is proportional to $\lambda f$, where $\lambda$ is the laser wavelength and f is the f-number of the optical system.

Moreover, certain applications of the invention involve selection of a wavelength at which a substrate has low absorption but an interconnect material has higher absorption than at conventional wavelengths of 1.047 $\mu$m and 1.064 $\mu$m or higher-than-conventional wavelengths. Because of the reduced reflectivity of the interconnect material, the incident laser energy can be reduced while the interconnect material nevertheless absorbs sufficient energy for the interconnect to be blown without multiple laser pulses (which can impact throughput) or substantial collateral damage due to the laser beam.

The invention can effect high-quality laser link cuts on high-conductivity interconnect materials such as copper, gold, and the like, arranged in closely-spaced patterns, with only a single laser pulse, and without damaging the substrate. The invention can further allow a smaller laser spot size than would be obtainable at wavelengths of 1.047 $\mu$m, 1.064 $\mu$m, or higher, while still providing acceptable link cuts.

DETAILED DESCRIPTION

Figure 1:
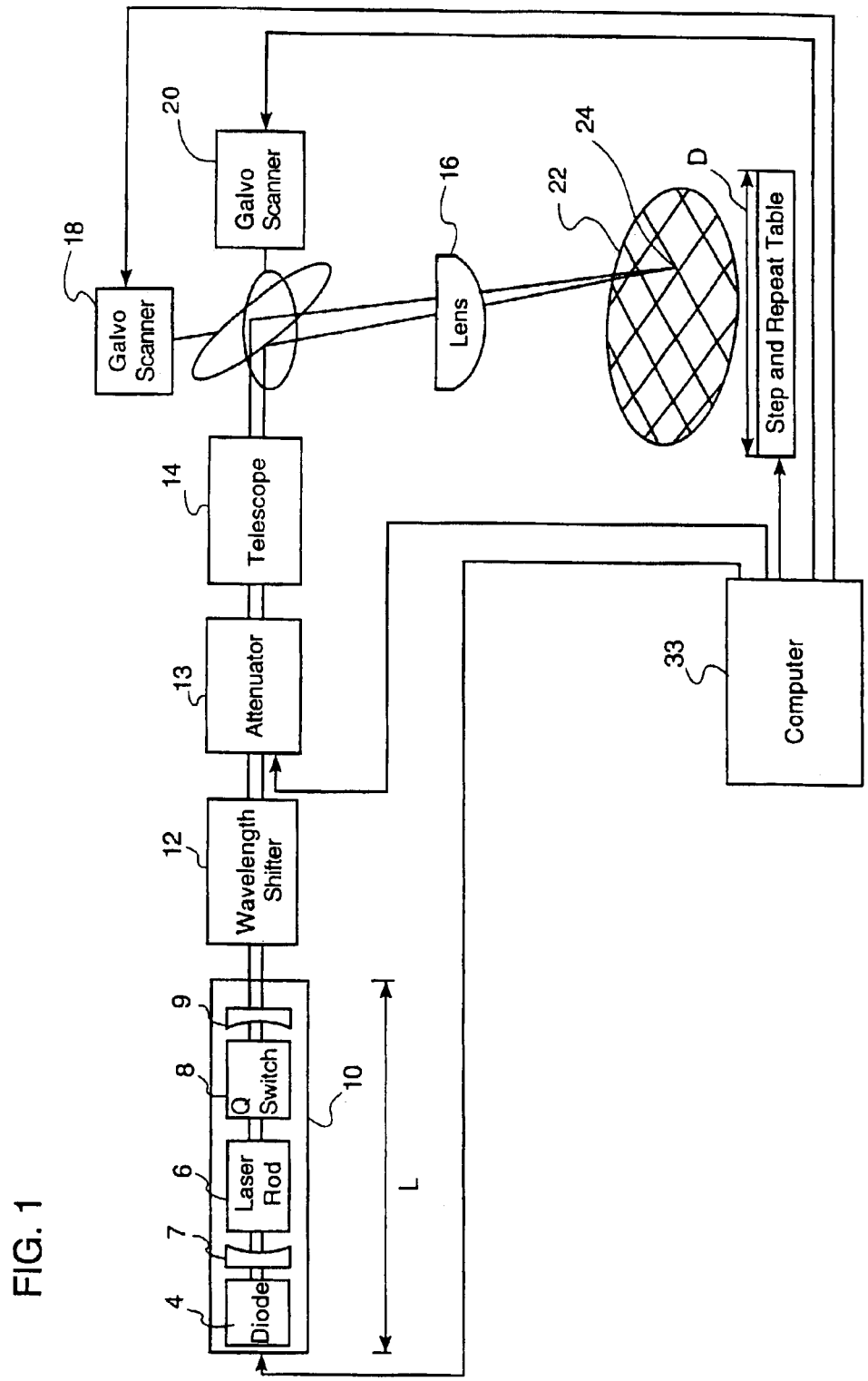
FIG. 1 is a block diagram of a laser system according to the invention for removing a link of a semiconductor device, where the link is manufactured of a material such as copper or gold.

In the block diagram of FIG. 1, a system for removing a link of a semiconductor device is shown. Laser 10 is constructed to operate at a conventional wavelength such as 1.047 μm. It is aligned to a laser output system that includes a wavelength shifter 12, such as a frequency doubler or an optical parametric oscillator (OPO), constructed to shift to a wavelength less than 0.55 μm, in the "green" region of the wavelength spectrum. As is explained in more detail below, the beam is then passed through the remainder of the laser output system, including a controlled electro-acousto-optic attenuator 13, a telescope 14 that expands the beam, and, a scanning head, that scans the beam over a focusing lens 16 by means of two scanner galvanometers, 18 and 20. The spot is focused onto wafer 22 for removing links 24, under control of computer 33.

The laser 10 is mounted on a stable platform 11 relative to the galvanometers and the work piece. It is controlled from outside of the laser itself by computer 33 to transmit its beam to the scanner head comprising the accurate X and Y galvanometers 18 and 20. It is very important, in removing links that the beam be positioned with accuracy of less than 3/10 of a micron. The timing of the laser pulse to correlate with the position of the continually moving galvanometers is important. The system computer 33 asks for a laser pulse on demand.

A step and repeat table moves the wafer into position to treat each semiconductor device.

In one embodiment, the laser 10 is a neodymium vanadate laser, with an overall length L of about 6 inches, and a short cavity length.

The shifter 12 of this preferred embodiment is external to the cavity, and is about another 4 inches long. In alternative embodiments, laser 10 can be configured to produce a laser output having an appropriate wavelength, so that no shifter would be required.

The laser is a Q-switched diode pumped laser, of sufficient length and construction to enable external control of pulse rate with high accuracy by computer 33.

The cavity of the laser includes a partially transmissive mirror 7, optimized at the wavelength at which the lasing rod 6 of neodymium vanadate is pumped by the diode. The partially transmissive output mirror 9 is also optimized at this wavelength.

The pumping diode 4 produces between about one and two watts depending on the design. It focuses onto the rear of the laser rod 6. As mentioned, the laser rod is coated, on its pumped end, with a mirror 7 appropriate for the standard laser wavelength of 1.064 μm or 1.047 μm. The other end of the rod is coated with a dichroic coating. Within the laser cavity is an optical Q-switch 8 in the form of an acousto-optic modulator. It is used as the shutter for establishing the operating frequency of the laser. Beyond the Q-switch is the output mirror 9. The two mirrors, 7 on the pumped end of the laser rod and 9 beyond the acoustic optical Q-switch, comprise the laser cavity.

A system optical switch 13 in the form of a further acousto-optic attenuator is positioned beyond the laser cavity, in the laser output beam. Under control of computer 33, it serves both to prevent the beam from reaching the galvanometers except when desired, and, when the beam is desired at the galvanometers, to controllably reduce the power of the laser beam to the desired power level. During vaporization procedures this power level may be as little as 10 percent of the gross laser output, depending upon operating parameters of the system and process. The power level may be about 0.1 percent of the gross laser output during alignment procedures in which the laser output beam is aligned with the target structure prior to a vaporization procedure.

In operation, the positions of the X, Y galvanometers. 10 and 12 are controlled by the computer 33 by galvanometer control G. Typically the galvanometers move at constant speed over the semiconductor device on the silicon wafer. The laser is controlled by timing signals based on the timing signals that control the galvanometers. The laser operates at a constant repetition rate and is synchronized to the galvanometers by the system optical switch 13.

Figure 2:
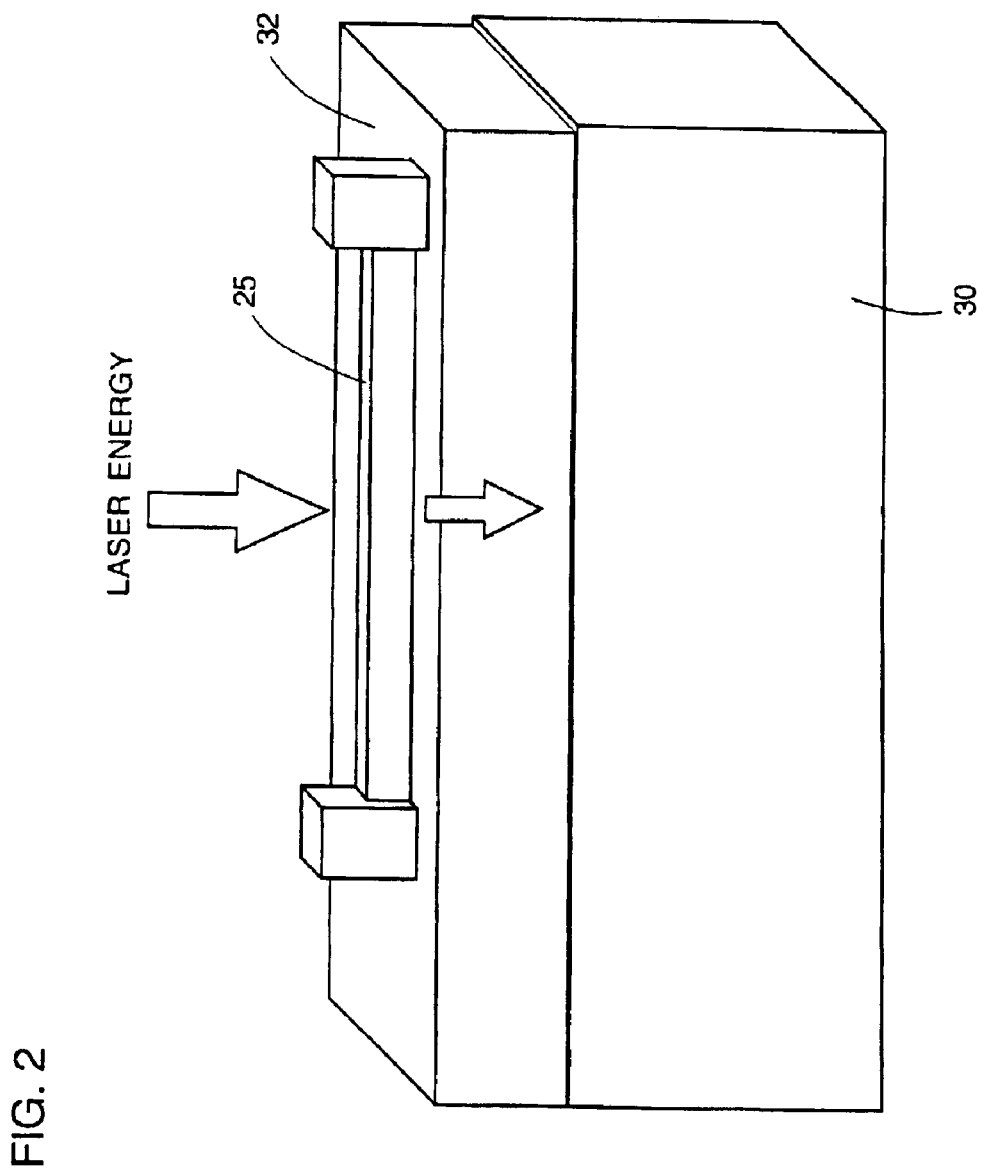
FIG. 2 is a perspective diagrammatic view of a link on a substrate of a semiconductor device.

In the system block diagram of FIG. 1 the laser beam is shown focused upon the wafer. In the magnified view of FIG. 2, the laser beam is seen being focused on a link element 25 of a semiconductor device.

The metal link is supported on the silicon substrate 30 by silicon dioxide insulator layer 32, which may be, e.g., 0.3–0.5 microns thick. Over the link is another layer of silicon dioxide (not shown). In the link blowing technique the laser beam impinges on the link and heats it to the melting point. During the heating the metal is prevented from vaporizing by the confining effect of the overlying layer of oxide. During the duration of the short pulse, the laser beam progressively heats the metal, until the metal so expands that the insulator material ruptures. At this point, the molten material is under such high pressure that it instantly vaporizes and blows cleanly out through the rupture hole.

The wavelength produced by wavelength shifter 12 is arrived at by considering on an equal footing the values of both the interconnect or link to be processed and the substrate, in such a way as to trade-off energy deposition in the substrate, which is undesirable, against energy deposition in the link structure, which is necessary to sever the link. Thus, the criteria for selecting the wavelength do not require the substrate to be very transparent, which is especially important if the wavelength regime in which the substrate is very transparent is much less than optimal for energy deposition in the link structure.

Figure 3:
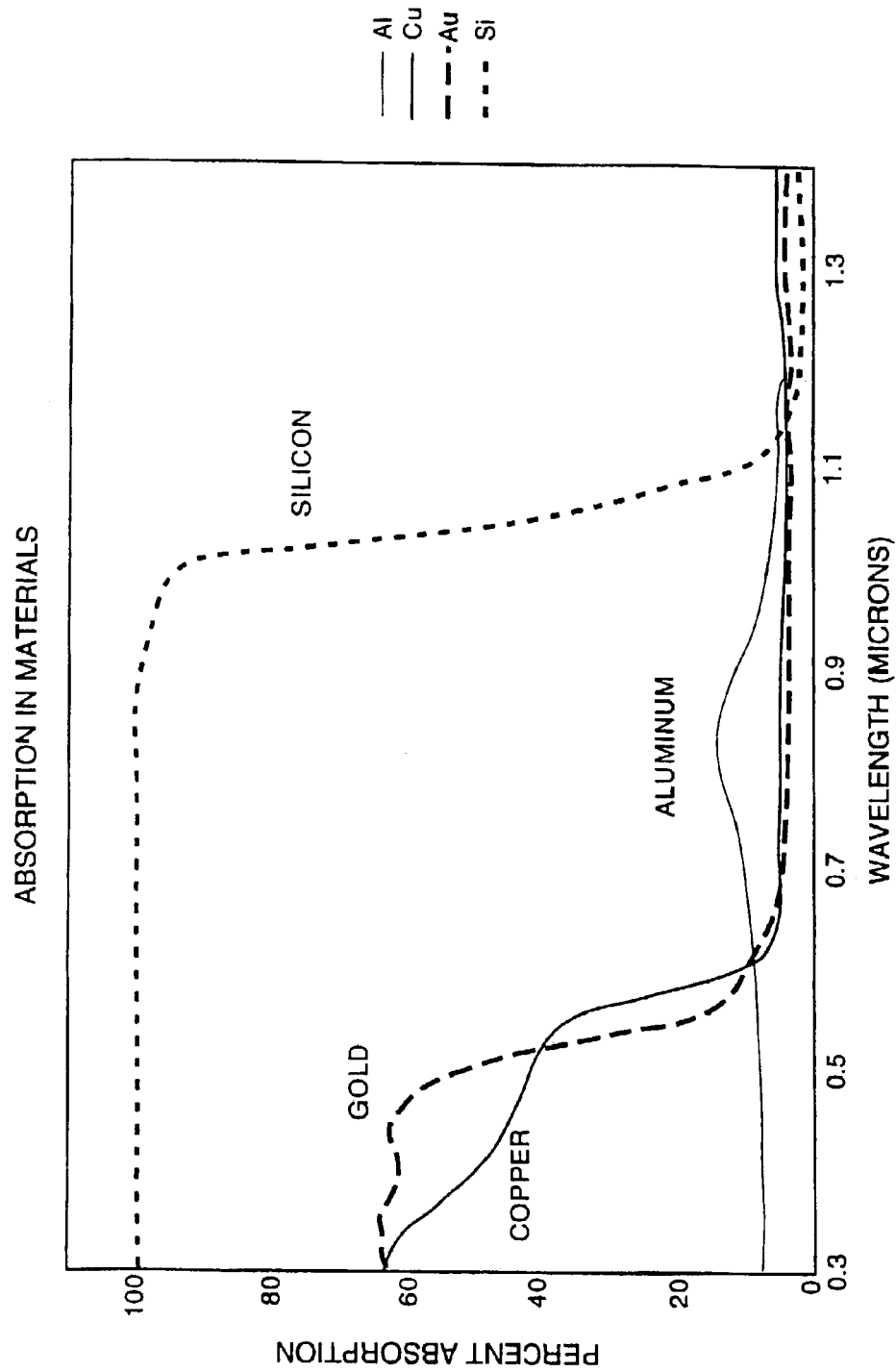
FIG. 3 is plot of absorption of copper, gold, aluminum, and silicon as a function of wavelength.

The criteria for selection of the appropriate wavelength are as follows:

1) Calculate the relative incident laser beam energy required to deposit unit energy in the link structure This relative incident laser beam energy is proportional to the inverse of the absorption of the link structure. For example, if the link structure has an absorption of 0.333, it will require three times as much incident laser energy to deposit as much energy in the link structure as it would if the structure had an absorption of 1. FIG. 3 illustrates absorption of copper, gold, aluminum, and silicon as a function of wavelength (copper, gold, and aluminum being possible link structure materials and silicon being a substrate material).

2) Using the incident beam energy computed in step (1), calculate the energy deposited in the substrate. For a well-matched laser spot, this energy will be proportional to the incident energy calculated in step (1), less the energy absorbed by the link structure, multiplied by the absorption of the substrate. In other words, the energy absorbed in the substrate is proportional to $(1/L-1) \times S$ (herein, "the substrate absorption function"), where L is the absorption in the link and S is the absorption in the substrate.

3) Look for low values of the substrate absorption function defined in step (2) as a function of laser wavelength.

Figure 4:
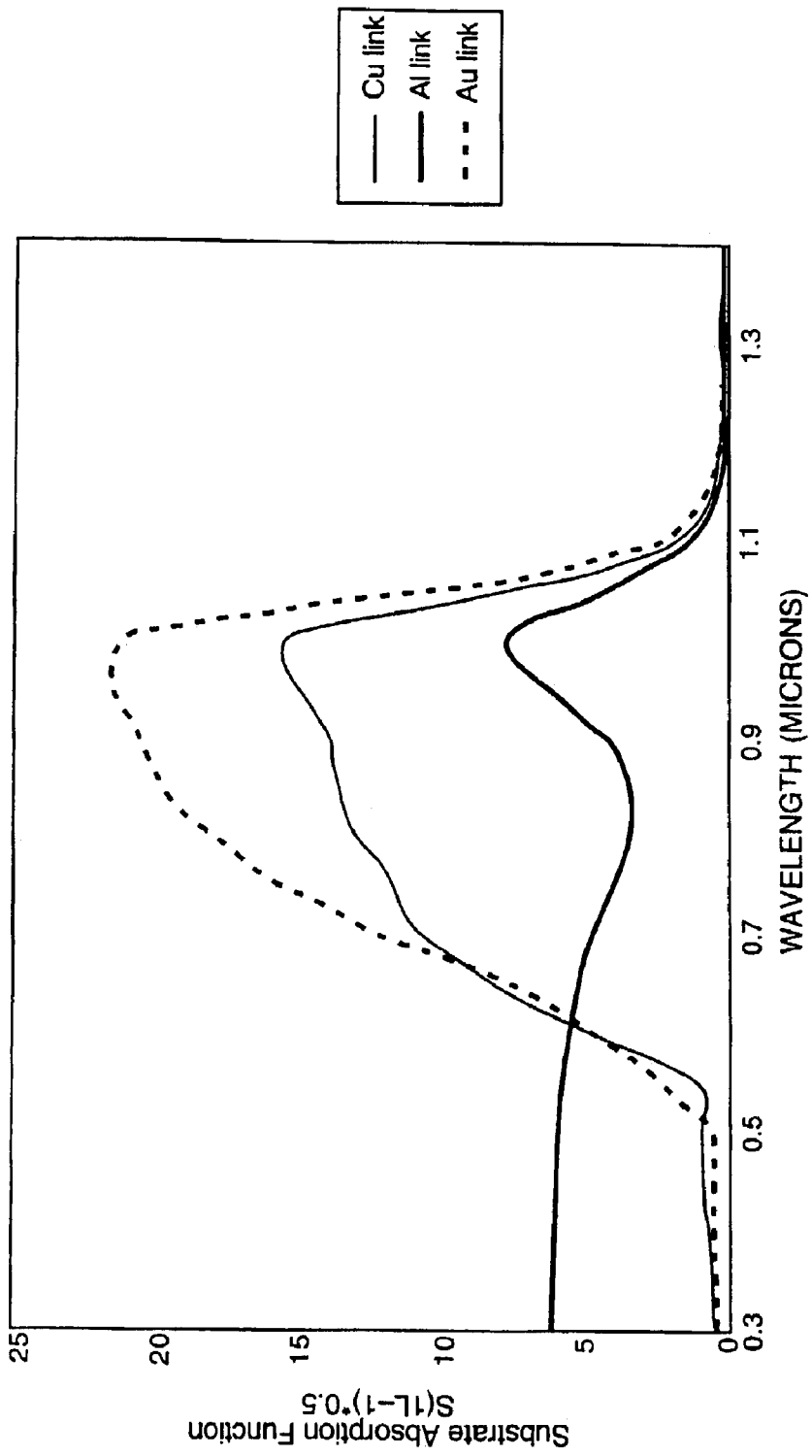
FIG. 4 is a plot of a substrate absorption function according to the invention, for copper, gold, and aluminum links on a silicon substrate, as a function of wavelength.

FIG. 4 illustrates the substrate absorption function for copper, gold, and aluminum links on a silicon substrate, as a function of wavelength in the range of 0.3 to 1.4 μm. The values of the substrate absorption function can be derived from the absorption curves illustrated in FIG. 3, using a proportionality constant (see step (2) above) arbitrarily chosen as 0.5 for the sake of specificity (this constant merely changes the vertical scale of FIG. 4, and does not alter any conclusions drawn from it).

It can be seen from FIG. 4 that for structures of gold and copper (but not for aluminum) there is a region of wavelength less than roughly 0.55 μm in which the substrate absorption function is comparable to that in the region of wavelength greater than 1.2 μm.

Figure 5:
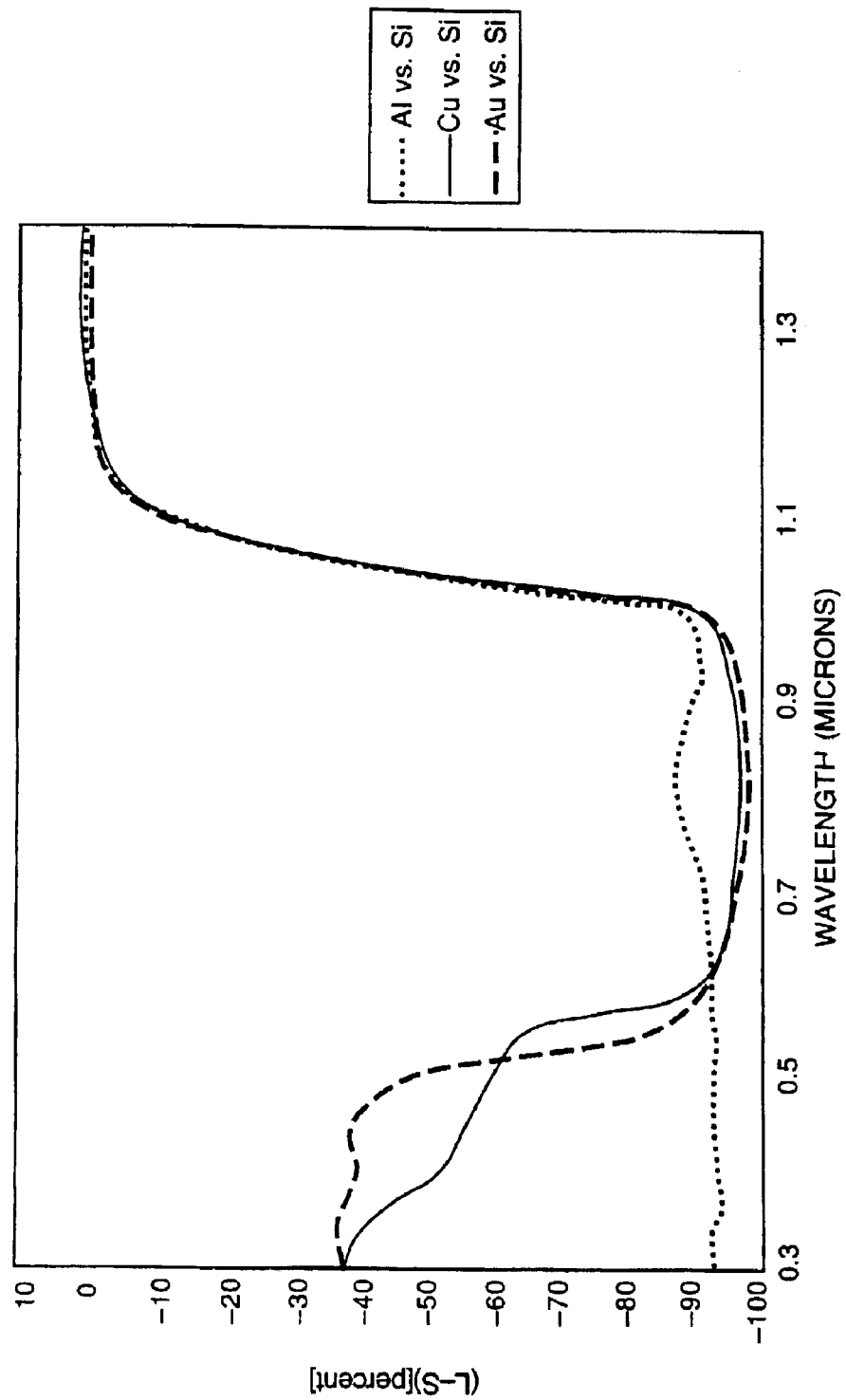
FIG. 5 is a plot of the function L−S for copper, gold, and aluminum links on a silicon substrate, where L is the absorption in the link and S is the absorption in the substrate.
Figure 6:
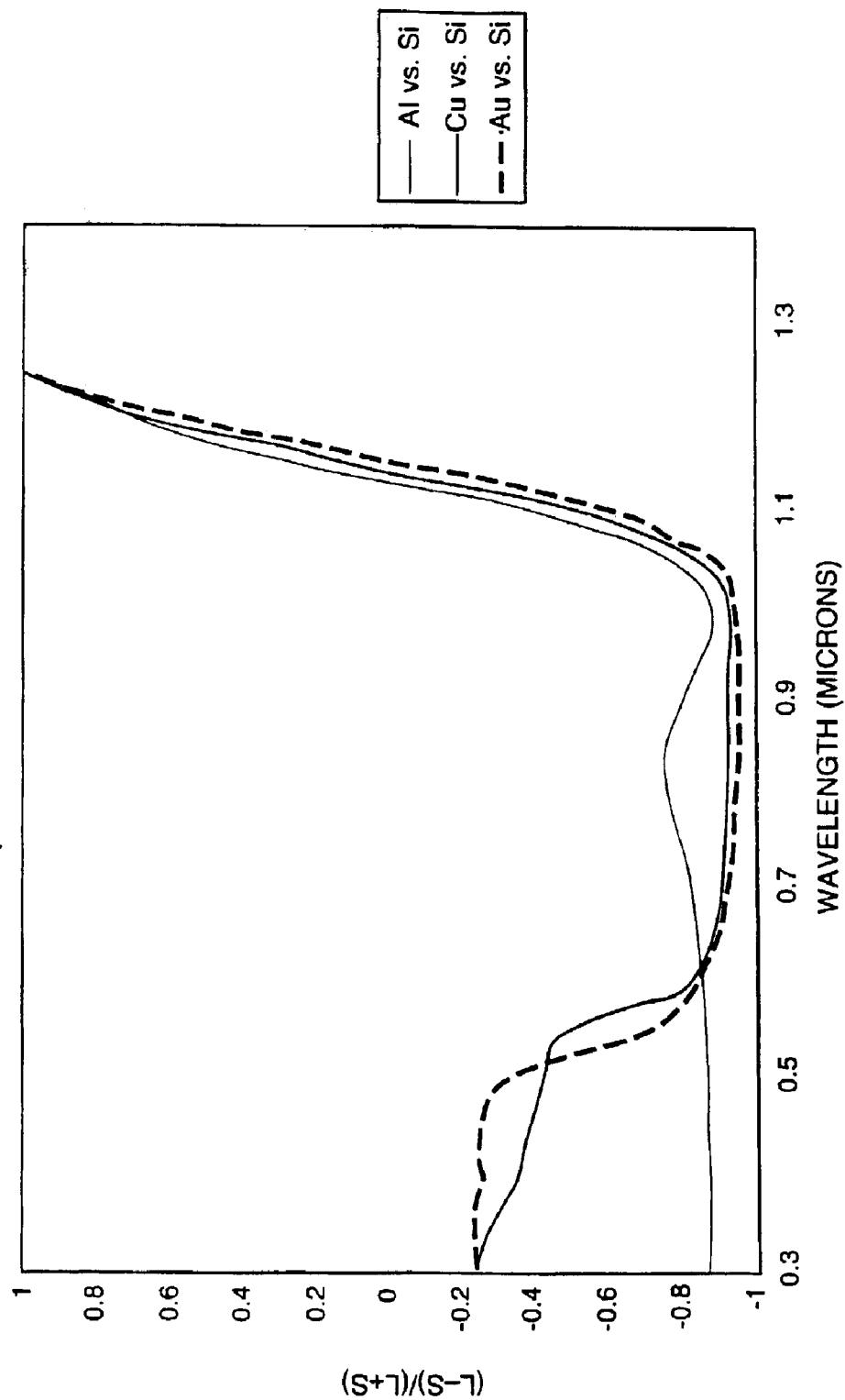
FIG. 6 is a plot of the function (L−S)/(L+S) for copper, gold, and aluminum links on a silicon substrate, where L is the absorption in the link and S is the absorption in the substrate.

It will also be noted that this function is quite different than the ones presented in FIGS. 5 and 6, which illustrate two possible functions representing simple absorption contrast. More specifically, FIG. 5 illustrates the function L−S, expressed as percentage, and FIG. 6 illustrates the function (L−S)/(L+S). In either case, the less-than −0.55 μm wavelength region is not found desirable according to FIGS. 5 and 6, even for gold or copper link structures, because the function shown in these figures is less than zero in this region. This negative value reflects the fact that the substrate is more absorptive than the link structure in this wavelength regime, and so, according to these models, this wavelength regime should not be selected.

What is claimed is:

1. A system for vaporizing a target structure on a silicon substrate, comprising:
    a laser pumping source;
    a laser resonator cavity configured to be pumped by the laser pumping source;
    a laser output system configured to produce a laser output from energy stored in the laser resonator cavity and to direct the laser output at the target structure on the silicon substrate in order to vaporize the target structure, at a wavelength below an absorption edge of the silicon substrate and below about 0.55 microns, the silicon substrate being positioned beneath the target structure with respect to the laser output, the laser output system being configured to produce the laser output at an incident beam energy;
    a computer programmed to generate computer-controlled timing signals synchronized with the position of the pulsed laser beam relative to the target structure; and
    an optical switch that is controllably switchable based on the timing signals so as to cause output pulses of the pulsed laser beam to be transmitted to the target structure;
    wherein the incident beam energy at which the target structure is vaporized is reduced relative to an incident beam energy necessary to deposit unit energy in the target structure sufficient to vaporize the target structure at a higher wavelength below the absorption edge of the silicon substrate.

2. The system of claim 1 wherein the laser output system comprises a wavelength shifter.

3. The system of claim 1 wherein the laser resonator cavity produces laser radiation at the wavelength corresponding to the relatively low value of energy expected to be deposited in the substrate.

4. The system of claim 1 wherein the target structure comprises a metal having a conductivity greater than that of aluminum.

5. The system of claim 4 wherein the metal comprises copper.

6. The system of claim 4 wherein the metal comprises gold.

7. The system of claim 3 wherein the target structure on the substrate comprises a link of a semiconductor device.

8. The system of claim 7 wherein the semiconductor device comprises an integrated circuit.

9. The system of claim 7 wherein the semiconductor device comprises a memory device.

10. The system of claim 3 wherein the energy expected to be deposited in the substrate is substantially proportional to the incident beam energy necessary to deposit unit energy in the target structure minus the energy deposited in the target structure, multiplied by absorption of the substrate.

11. The system of claim 1 wherein the identified wavelength corresponding to a relatively low value of the energy expected to be deposited in the silicon substrate is within a visible region of spectrum.

12. The system of claim 11 wherein the identified wavelength corresponding to a relatively low value of the energy expected to be deposited in the silicon substrate is within a green region of spectrum.

13. The system of claim 1 wherein the laser output at the incident beam energy comprises short pulses.

14. The system of claim 1 wherein the laser resonator cavity is a neodymium vanadate laser resonator cavity.

15. A system for vaporizing a target structure on a silicon substrate, comprising:
    a laser pumping source;
    a laser resonator cavity configured to be pumped by the laser pumping source;
    a laser output system configured to produce a laser output from energy stored in the laser resonator cavity and to direct the laser output at the target structure on the silicon substrate in order to vaporize the target structure, at a wavelength below an absorption edge of the silicon substrate and below about 0.55 microns, the silicon substrate being positioned beneath the target structure with respect to the laser output, the laser output system being configured to produce the laser output at an incident beam energy, the laser output comprising short pulses;
    a computer programmed to generate computer-controlled timing signals synchronized with the position of the pulsed laser beam relative to the target structure; and
    an optical switch that is controllably switchable based on the timing signals so as to cause output pulses of the pulsed laser beam to be transmitted to the target structure.

16. The system of claim 15 wherein the laser resonator cavity is a neodymium vanadate laser resonator cavity.

17. A system for vaporizing a target structure on a silicon substrate, comprising:
    a laser pumping source;
    a laser resonator cavity configured to be pumped by the laser pumping source;
    a laser output system configured to produce a laser output from energy stored in the laser resonator cavity and to direct the laser output at the target structure on the silicon substrate in order to vaporize the target structure, at a wavelength below an absorption edge of the silicon substrate and below about 0.55 microns, the silicon substrate being positioned beneath the target structure with respect to the laser output, the laser output system being configured to produce the laser output at an incident beam energy;
    a computer programmed to generate computer-controlled timing signals synchronized with the position of the pulsed laser beam relative to the target structure; and an optical switch that is controllably switchable based on the timing signals so as to cause output pulses of the pulsed laser beam to be transmitted to the target structure;

wherein the incident beam energy at which the target structure is vaporized is reducible relative to an incident beam energy necessary to deposit unit energy in the target structure sufficient to vaporize the target structure at a higher wavelength below the absorption edge of the silicon substrate.

18. A method of vaporizing a target structure on a silicon substrate, comprising the steps of:

providing a laser system configured to produce a laser output at a wavelength below an absorption edge of the silicon substrate and below about 0.55 microns; and directing the laser output at the target structure on the silicon substrate at the wavelength and at an incident beam energy, in order to vaporize the target structure, the silicon substrate being positioned beneath the target structure with respect to the laser output;

generating computer-controlled timing signals synchronized with the position of the pulsed laser beam relative to the target structure;

controllably switching an optical switch based on the timing signals so as to cause output pulses of the pulsed laser beam to be transmitted to the target structure;

wherein the incident beam energy at which the target structure is vaporized is reduced relative to an incident beam energy necessary to deposit unit energy in the target structure sufficient to vaporize the target structure at a higher wavelength below the absorption edge of the silicon substrate.

19. The method of claim 18 wherein the identified wavelength corresponding to a relatively low value of the energy expected to be deposited in the silicon substrate is within a visible region of spectrum.

20. The method of claim 19 wherein the identified wavelength corresponding to a relatively low value of the energy expected to be deposited in the silicon substrate is within a green region of spectrum.

21. The method of claim 18 wherein the laser output at the incident beam energy comprises short pulses.

22. The method of claim 18 wherein the laser system comprises a neodymium vanadate laser.

23. A method of vaporizing a target structure on a silicon substrate, comprising the steps of:

providing a laser system configured to produce a laser output at a wavelength below an absorption edge of the silicon substrate and below about 0.55 microns; and directing the laser output at the target structure on the silicon substrate at the wavelength and at an incident beam energy, in order to vaporize the target structure, the silicon substrate being positioned beneath the target structure with respect to the laser output, wherein the laser output at the incident beam energy comprises short pulses;

generating computer-controlled timing signals synchronized with the position of the pulsed laser beam relative to the target structure; and controllably switching an optical switch based on the timing signals so as to cause output pulses of the pulsed laser beam to be transmitted to the target structure.

24. The method of claim 23 wherein the laser system comprises a neodymium vanadate laser.

25. A method of vaporizing a target structure on a silicon substrate, comprising the steps of:

providing a laser system configured to produce a laser output at a wavelength below an absorption edge of the silicon substrate and below about 0.55 microns; and directing the laser output at the target structure on the silicon substrate at the wavelength and at an incident beam energy, in order to vaporize the target structure, the silicon substrate being positioned beneath the target structure with respect to the laser output;

generating computer-controlled timing signals synchronized with the position of the pulsed laser beam relative to the target structure;

controllably switching an optical switch based on the timing signals so as to cause output pulses of the pulsed laser beam to be transmitted to the target structure;

wherein the incident beam energy at which the target structure is vaporized is reducible relative to an incident beam energy necessary to deposit unit energy in the target structure sufficient to vaporize the target structure at a higher wavelength below the absorption edge of the silicon substrate.

* * * * *